United States Patent
Kang et al.

(10) Patent No.: US 8,176,375 B2
(45) Date of Patent: May 8, 2012

(54) DTV TRANSMITTER AND METHOD OF CODING DATA IN DTV TRANSMITTER

(75) Inventors: Kyung Won Kang, Seoul (KR); In Hwan Choi, Gyeonggi-do (KR); Kook Yeon Kwak, Gyeonggi-do (KR)

(73) Assignee: LG Electronics Inc., Seoul (KR)

( * ) Notice: Subject to any disclaimer, the term of this patent is extended or adjusted under 35 U.S.C. 154(b) by 94 days.

(21) Appl. No.: 12/772,915

(22) Filed: May 3, 2010

(65) Prior Publication Data

US 2010/0211855 A1    Aug. 19, 2010

Related U.S. Application Data

(63) Continuation of application No. 11/513,789, filed on Aug. 30, 2006, now Pat. No. 7,739,574.

(30) Foreign Application Priority Data

Jan. 27, 2006    (KR) .................. 10-2006-0009145

(51) Int. Cl.
*H04L 1/00*    (2006.01)

(52) U.S. Cl. ............... 714/746; 375/240.1; 375/265; 375/295; 375/316; 714/755; 714/776; 714/784; 714/792; 714/795

(58) Field of Classification Search ............... 375/240.1, 375/265, 295, 316; 714/746, 755, 792, 795
See application file for complete search history.

(56) References Cited

U.S. PATENT DOCUMENTS

| 7,111,221 | B2 | 9/2006 | Birru et al. |
| 7,206,352 | B2 | 4/2007 | Birru et al. |
| 2002/0085632 | A1 | 7/2002 | Choi et al. |
| 2002/0194570 | A1 | 12/2002 | Birru et al. |
| 2004/0090997 | A1 | 5/2004 | Choi et al. |
| 2005/0249300 | A1 | 11/2005 | Jeong et al. |

FOREIGN PATENT DOCUMENTS

EP    0912008    4/1999

*Primary Examiner* — Leon Flores
(74) *Attorney, Agent, or Firm* — Lee, Hong, Degerman, Kang & Waimey

(57) ABSTRACT

A DTV transmitter includes a pre-processor which pre-processes enhanced data by coding the enhanced data for forward error correction (FEC) and expanding the FEC-coded enhanced data, a data formatter which generates enhanced data packets having the pre-processed enhanced data and known data, and a multiplexer which multiplexes the enhanced data packets with main data packets. The DTV transmitter further includes an RS encoder which adds systematic parity data to each main data packet and adds RS parity place holders to each enhanced data packet, and a data interleaver which interleaves the RS-coded main and enhanced data packets and outputs a group of interleaved data packets having a head, a body, and a tail. The body includes a plurality of consecutive enhanced data packets, to which a known data sequence is periodically inserted.

9 Claims, 10 Drawing Sheets

(a)

(b)

(c)

Head    Body    Tail    Main data

DTV TRANSMITTER AND METHOD OF CODING DATA IN DTV TRANSMITTER

This application is a continuation of U.S. patent application Ser. No. 11/513,789, filed on Aug. 30, 2006, now U.S. Pat. No. 7,739,574, which claims the benefit of earlier filing date and right of priority to Korean Patent Application No. 10-2006-0009145, filed on Jan. 27, 2006, the contents of which are all hereby incorporated by reference herein in their entirety.

BACKGROUND OF THE INVENTION

1. Field of the Invention

The present invention relates to a digital communication system, and more particularly, to a digital television (DTV) transmitter and a method of coding data in a DTV transmitter.

2. Discussion of the Related Art

8T-VSB transmission of digital broadcast transmissions has been developed to transmit MPEG video/audio data, and was adopted as digital broadcast standard in North America and the Republic of Korea. With rapid development of digital signal processing technology and spread of the Internet, more and more technologies for digital appliances, computers and internet technology are being integrated. Therefore, it is necessary to develop systems to transmit various supplemental data as well as video/audio data to users via digital broadcast channels to satisfy users' demands.

Some of digital data broadcast users will use the supplemental data broadcast through a PC card or a portable device to which an indoor antenna is installed. However, when such a PC card and the portable device are used indoors, broadcast receiving performance is significantly decreased as intensities of broadcast signals are seriously reduced by walls and moving objects indoors and ghost images and noise are generated by reflection waves. Especially, transmission of the supplemental data must have a relatively low error rate unlike that of general video/audio data. Namely, although the video/audio data has errors therein during its transmission, if the errors are errors which cannot be detected by users' ears and eyes, there may be no problems. On the other hand, when the supplemental data (for example, an application program execution file, stock information, etc.) has an error, the error, of even one bit, may cause a serious problem. Therefore, it is needed to develop a system which is resistant against ghost images and noise which may be generated in channels.

Transmission for supplemental data is generally performed through a channel identical to an MPEG video/audio channel, on the basis of time division method. On the other hand, after digital broadcasting has started, ATSC VSB digital broadcast receiver, which is capable of receiving only MPEG video/audio, has been widely sold on the market. Therefore, the supplemental data, which is transmitted through channel identical to an MPEG video/audio channel, must not affect the conventional ATSC VSB dedicated receivers that have been sold on the market, which can be defined as "ATSC VSB compatible." Considering such conditions, newly developed supplemental data broadcast system must be compatible with the ATSC VSB system. Here, the supplemental data is also referred to as enhanced data or E-VSB data.

Also, the conventional ATSC VSB receiving system suffers from deteriorated receiving performance in bad channel environments. Especially, portable and mobile receivers require resistance against channel variation and noise.

SUMMARY OF THE INVENTION

Accordingly, the present invention is directed to a digital broadcast system and a data coding method that substantially obviate one or more problems due to limitations and disadvantages of the related art.

An object of the present invention is to provide a digital broadcast system which is suitable for transmission of supplemental data and is resistant to noise.

An another object of the present invention is to provide a digital broadcast system and a data coding method, which are capable of enhancing receiver performance as enhanced data is stratified and multiplexed together with main data.

Yet another object of the present invention is to provide a digital broadcast system and a data coding method, which are capable of enhancing receiver performance as known data, which is identified at transmitting/receiving systems, and enhanced data is stratified and multiplexed together with main data.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a digital television (DTV) transmitter for coding main and enhanced data for transmission includes a pre-processor, a data formatter, a packet multiplexer, an RS encoder, and a data interleaver. The pre-processor pre-processes the enhanced data by coding the enhanced data for forward error correction (FEC) and expands the FEC-coded enhanced data by inserting null data. The data formatter generates enhanced data packets including the pre-processed enhanced data and inserts known data to the enhanced data packets. The packet multiplexer multiplexes the enhanced data packets with main data packets including the main data. The RS encoder encodes the multiplexed main and enhanced data packets by adding systematic parity data to each main data packet and by adding RS parity place holders to each enhanced data packet. The data interleaver interleaves the RS-coded main and enhanced data packets and outputs a group of interleaved data packets having a head, a body, and a tail. The body may include a plurality of consecutive enhanced data packets, to which a known data sequence is periodically inserted (e.g., for every $6^{th}$ packet). In addition, the plurality of consecutive enhanced data packets may be high-priority enhanced data packets, and low-priority enhanced data packets may be included in at least one of the head and tail.

The DTV transmitter according to the present invention may further include a byte-symbol converter which converts the interleaved data packets into symbols, and a trellis encoder which trellis-encodes the symbols. The trellis encoder is initialized each time the symbols outputted from the byte-symbol converter represent a beginning of a known data sequence such that an output from the trellis encoder has a known data pattern when an input to the trellis encoder has a known data pattern. The DTV transmitter may further include an initialization controller which generates initialization data symbols required to initialize one or more memories included in the trellis encoder, and a multiplexer for outputting the initialization data symbols to the trellis encoder each time the symbols from the byte-symbol converter represent the beginning of a known data sequence. The DTV transmitter may further include a backward-compatibility processor which generates new parity data symbols based on an output of the RS encoder and the initialization data symbols and provides the new parity data symbols to the multiplexer. The multiplexer then outputs the new parity data symbols to the trellis encoder each time the symbols from the byte-symbol converter represent the RS parity place holders.

In another aspect of the present invention, a DTV transmitter for coding data includes a pre-processor, a data formatter, a packet multiplexer, an RS encoder, and a data interleaver. The pro-processor pre-processes high-priority and low-priority enhanced data by coding the enhanced data for forward error correction (FEC) and expands the FEC-coded high-priority and low-priority enhanced data at first and second expansion rates, respectively. The data formatter generates high-priority and low-priority enhanced data packets including the pre-processed high-priority and low-priority enhanced data, respectively, and it inserts known data to the high-priority enhanced data packets. The packet multiplexer multiplexes the enhanced data packets with main data packets including the main data, and the RS encoder encodes the multiplexed data packets by adding systematic parity data to each main data packet and by adding RS parity place holders to each enhanced data packets. The data interleaver interleaves the RS-coded data packets and outputs a group of interleaved data packets having a head, a body, and a tail, where the body may include a plurality of consecutive high-priority enhanced data packets, to which a known data sequence is periodically inserted.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

The terminologies disclosed the present application are widely used in this fields of the present invention. However, some of them are defined by the inventors. In this case, the newly defined terminologies are described in detail as follows. Therefore, the terminologies in the present invention will be understood on the basis of the disclosure of the present application.

Enhanced data in the present application may be any of application program execution files, data having information, such as stock information, etc., and video/audio data. Known data may be data which is previously known in transmitting/receiving ends, based on a protocol. Main data is indicative of data which can be received by the conventional receiving systems, including video/audio data.

In order to group a plurality of enhanced data packets having information, multiplex the group with main data, and transmit them, the present invention stratifies the group to form a plurality of regions, and classifies types of inserted data, and processing methods, etc., according to characteristics of stratified regions.

Especially, when an enhanced data packet is configured to include at least one of enhanced data having information and known data, which are identified at transmitting/receiving ends, and the plurality of enhanced data packets are grouped, the present invention serves to determine a place of known data which is inserted to the group, a place of initialization data, and an RS parity place, referring to characteristics of stratified regions of the group.

Figure 1:
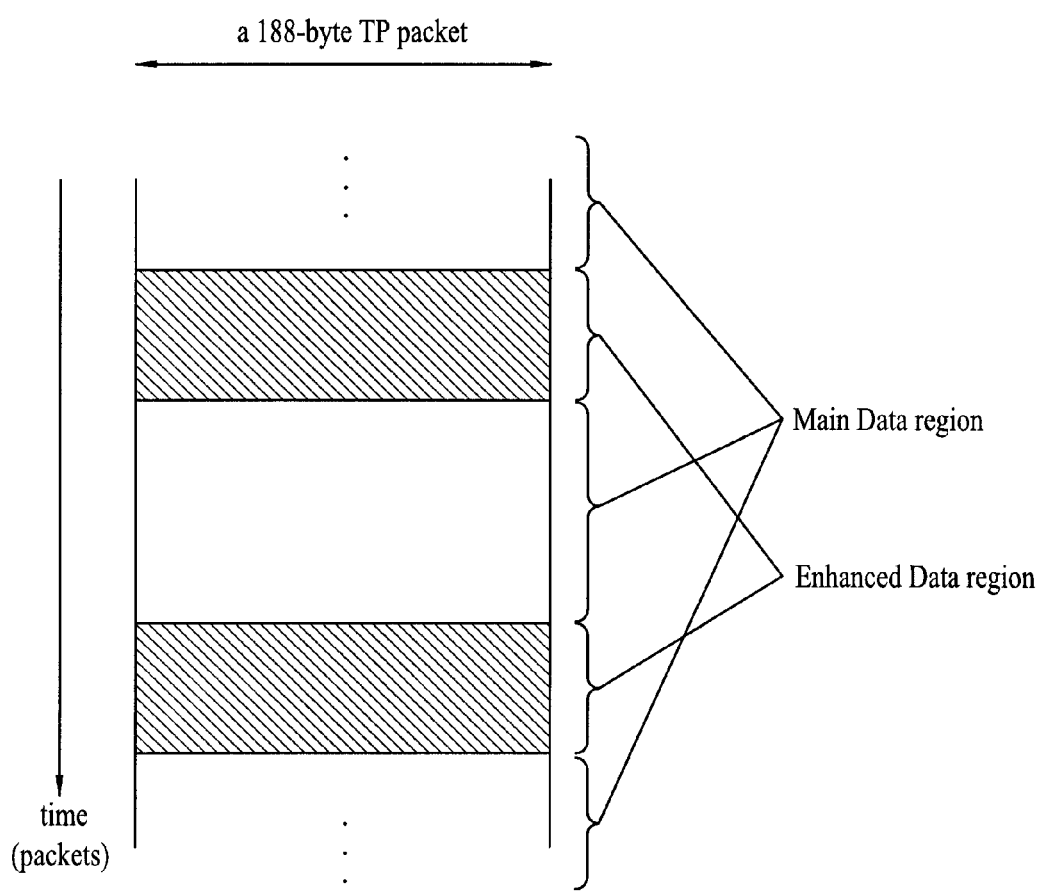
FIG. 1 illustrates a representation of an E-VSB data transmission pattern which is multiplexed on the basis of a transport packet unit, according to an embodiment of the present invention.

FIG. 1 illustrates a view for an E-VSB data transmission pattern which is multiplexed on the basis of transport packet unit, according to an embodiment of the present invention. Namely, FIG. 1 is a view for describing how the main data and the enhanced data are multiplexed, on the basis of an MPEG transport (TP) packet unit, and then transmitted. Especially, the enhanced data is transmitted in a state where enhanced data packets are grouped on the basis of predetermined plural number.

As shown in FIG. 1, a TP packet of 188 byte unit (a 188-byte TP packet) is converted to a 207-byte packet as MPEG synchronization byte is removed in a randomizing process, and 20 bytes are added thereto in a Reed-Solomon (RS) encoding. The RS encoded packet data is interleaved in a data interleaver (not shown) and then outputted.

Namely, when the randomized 187 byte packet is a main packet, systematic RS encoding is performed to add a parity of 20 bytes to the end of the data of 187 bytes and data interleaving is performed, like the conventional ATSC VSB system. On the other hand, when the randomized 187 byte packet is an enhanced data packet, a non-systematic RS parity place holder of 20 bytes is inserted to the packet and the bytes in the enhanced data packet are inserted to the places of the remaining 187 bytes. After that, data interleaving is performed.

Figure 2A:
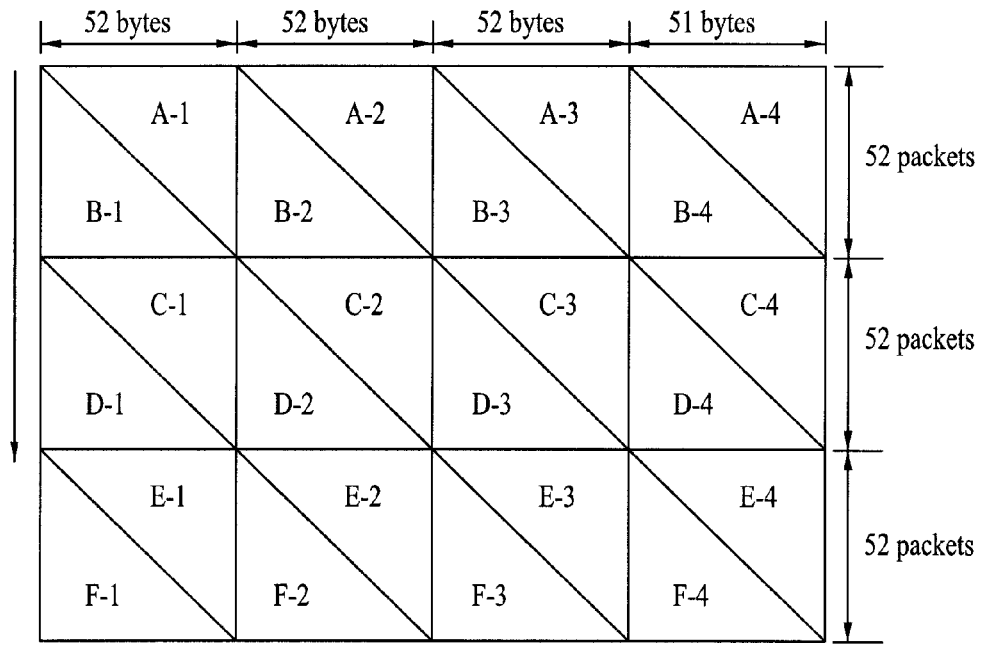
FIG. 2A illustrates a representation of data configuration at an input end of a data interleaver in a digital broadcast transmitting system according to the present invention.
Figure 2B:
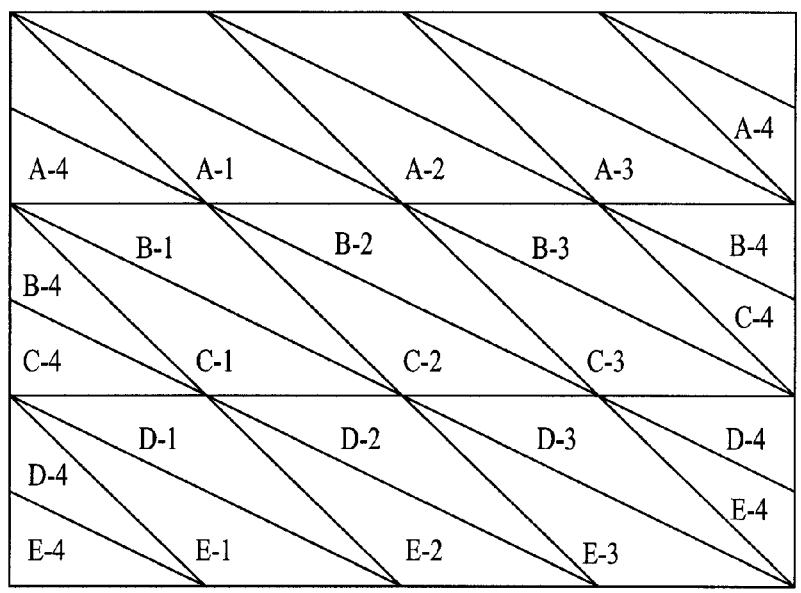
FIG. 2B illustrates a representation of data configuration at an output end of a data interleaver in a digital broadcast transmitting system according to the present invention.

FIG. 2A illustrates a representation of data configuration at an input end of a data interleaver in a digital broadcast transmitting system, and FIG. 2B illustrates a representation of data configuration at an output end of a data interleaver in a digital broadcast transmitting system.

As shown in FIG. 2A, the data interleaver inputs its inputs from up to down and from left to right, based on packet sequence. Also, as shown in FIG. 2B, the data interleaver outputs its outputs from up to down and from left to right. Namely, as shown in FIG. 2A, the data interleaver outputs A first, and then combination of B and C, combination of D and E, and F last, thereby outputting data as shown in FIG. 2B.

Afterward, when the main data and the enhanced data are multiplexed on the basis of a packet unit, and the enhanced data is grouped as a predetermined plural number of enhanced data packets and transmitted, 104 packets of A, B, C, and D are formed as a single enhanced data group and then transmitted, as shown in FIG. 2A. In this case, when analyzing configuration of the output data of the data interleaver of FIG. 2B, the enhanced data in the regions B and C can be continuously and successively outputted but the enhanced data in the region A or D can be outputted, in a state they are combined with main data.

In the present invention, the enhanced data group is stratified into three parts, head, body and tail. Namely, on the basis of output of the data interleaver, the head is firstly outputted from the enhanced data group, the body is outputted after the head, and the tail is outputted last. Here, on the basis of the time after performing data interleaving, the body is allocated to include a part of or all of the regions where the enhanced data in the enhanced data group are continuously and successively outputted. Here, the body may include a region where enhanced data is non-continuously outputted.

Figure 3:
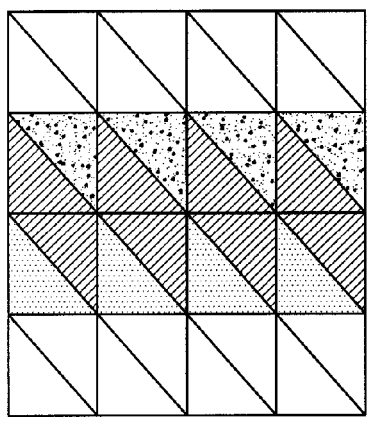
FIG. 3A to FIG. 3C illustrate E-VSB data groups according to the present invention.
Figure 3:
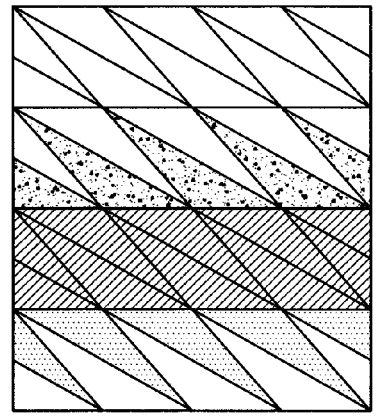
Figure 3:
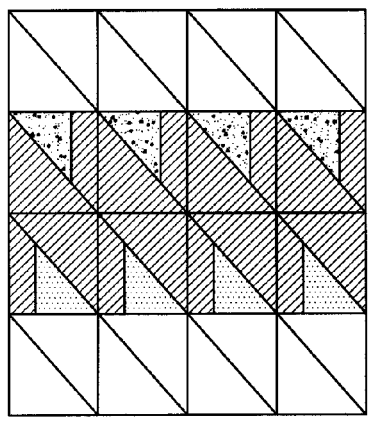
Figure 3:
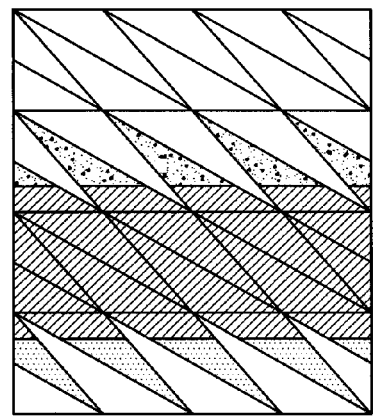
Figure 3:
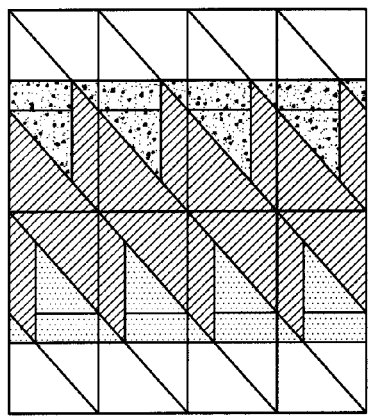
Figure 3:
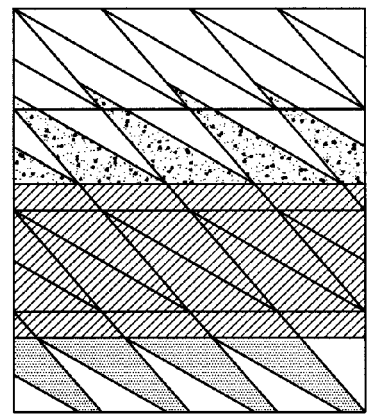
Figure 3:
Figure 3:
Figure 3:
Figure 3:

FIG. 3A to FIG. 3C illustrate E-VSB data groups according to the present invention, in which a predetermined number of enhanced data packets form a group, such that the group can be divided into head, body, and tail regions.

Left figure in each of FIG. 3A to FIG. 3C shows data configuration before performing data interleaving, and right figure in each of FIG. 3A to FIG. 3C shows data configuration after performing data interleaving.

FIG. 3A and FIG. 3B illustrate views for describing a case where 104 packets form an enhanced data group. Since the data interleaver is periodically operated on the basis of 52 packet units, the enhanced data group can be formed on the basis of 52 packet times.

On the other hand, as shown in FIG. 3A and FIG. 3C, the body regions for configuration of data, which are outputted from the output end of the data interleaver, form a rectangular shape. Namely, the body region is set in the enhanced data group, such that it cannot be mixed in the main data region while it is processed, but it can be formed by only enhanced data.

The enhanced data group is divided into three regions to be used for different purposes. Namely, since the regions corresponding to the Bodies of FIG. 3A and FIG. 3C are configured by only enhanced data without interference of main data while they are processed, they have relatively high receiving performance. On the other hand, since the enhanced data in the head and tail regions may mixed with main data while the outputs are outputted from the data interleaver, the receiving performance of the head and tail regions is relatively lower than that of the body region.

In addition, in a system in which known data is inserted in the enhanced data and then transmitted, when a long and continuous known data sequence is to be periodically inserted in the enhanced data, the known data can be inserted to a region in which main data is not mixed therewith, on the basis of the output sequence of the data interleaver. Namely, as shown in FIG. 3A and FIG. 3C, known data with a predetermined length can be periodically inserted to the body region. However, it is difficult to periodically insert the known data to the head and tail regions, and also, it is impossible to insert a relatively long and continuous sequence of known data thereto.

Figure 4A:
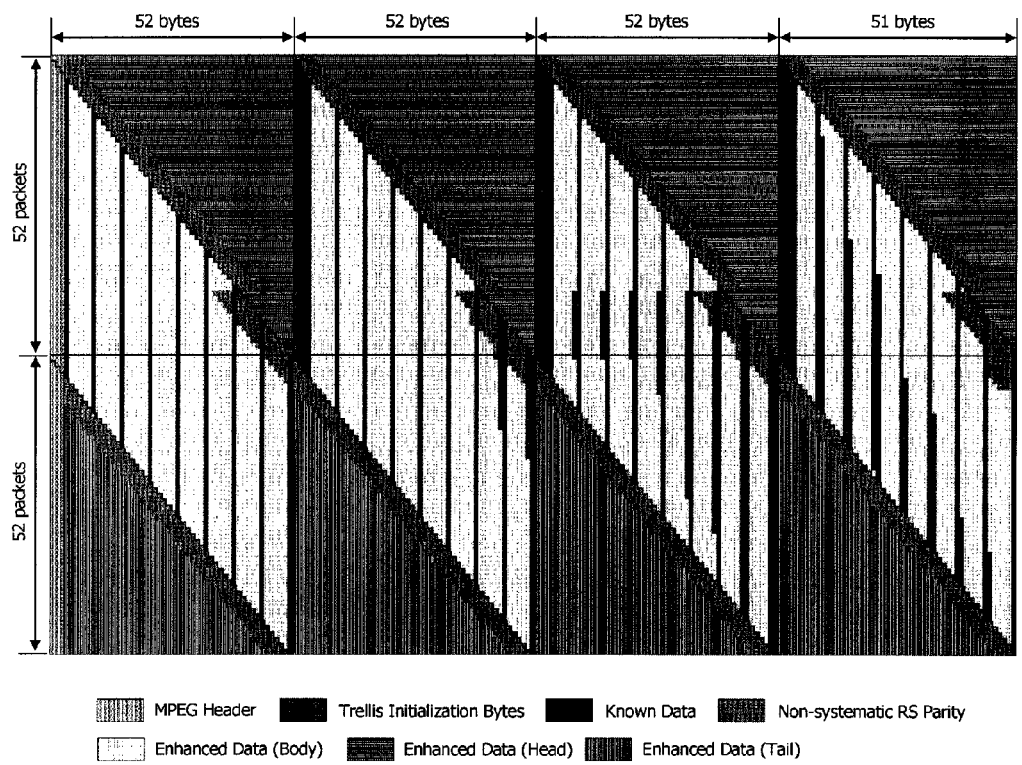
FIG. 4A illustrates a representation of data configuration at the input end of a data interleaver when known data is inserted to a body region in a group at a period of 6 packets, according to the present invention.
Figure 4B:
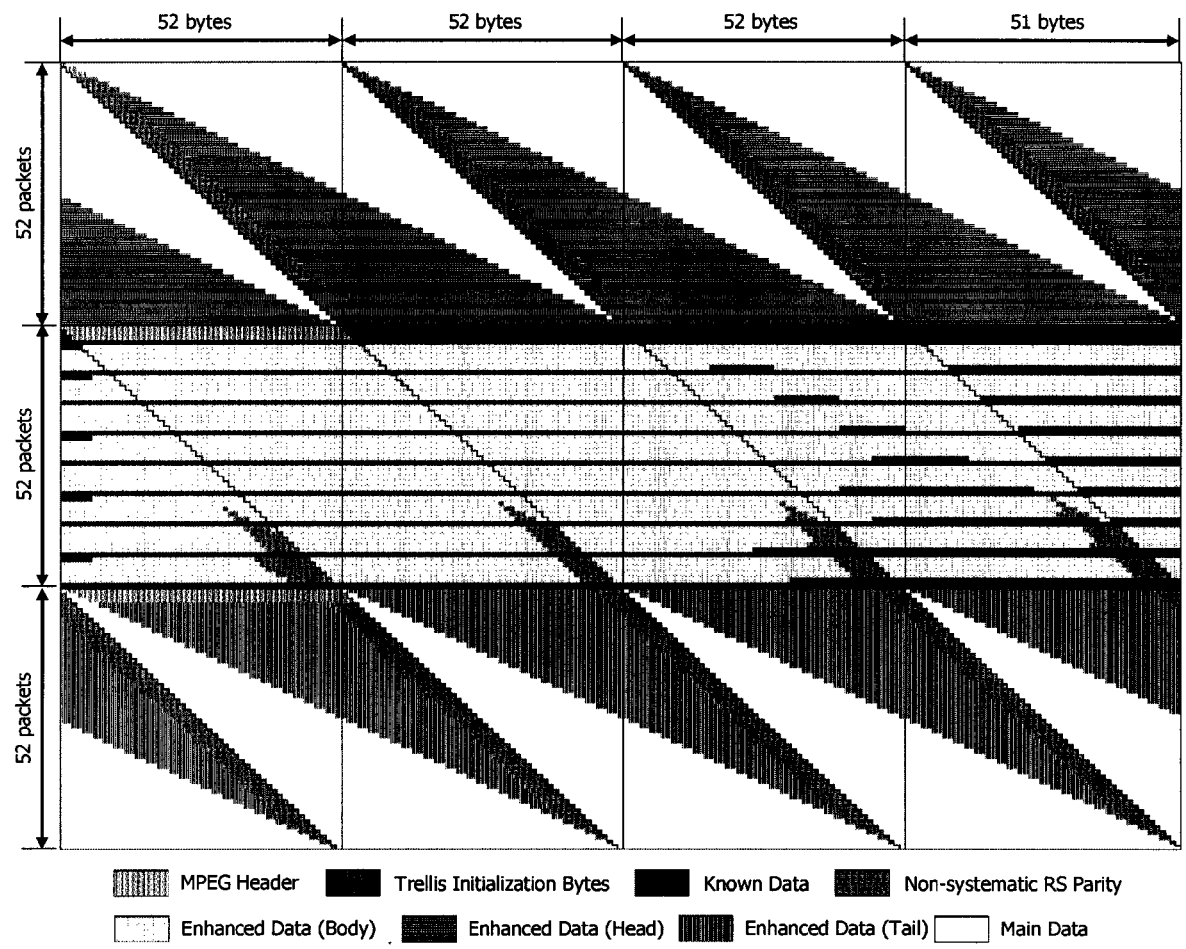
FIG. 4B illustrates a representation of data configuration at the output end of a data interleaver when known data is inserted to a body region in a group at a period of 6 packets, according to the present invention.

FIG. 4A and FIG. 4B illustrate embodiments in which enhanced data groups are configured as FIG. 3A and known data is inserted in the body region. Namely, known data is inserted to the body region in a single enhanced data group at a period of 6 packets (or segments), and also, the known data is additionally added to the beginning part of the body region.

FIG. 4A illustrates a representation of data configuration at the input end of a data interleaver when known data is inserted to a body region in a group at a period of 6 packets, and FIG. 4B illustrates a representation of data configuration at the output end of a data interleaver when known data is inserted to a body region in a group at a period of 6 packets.

Figure 5A:
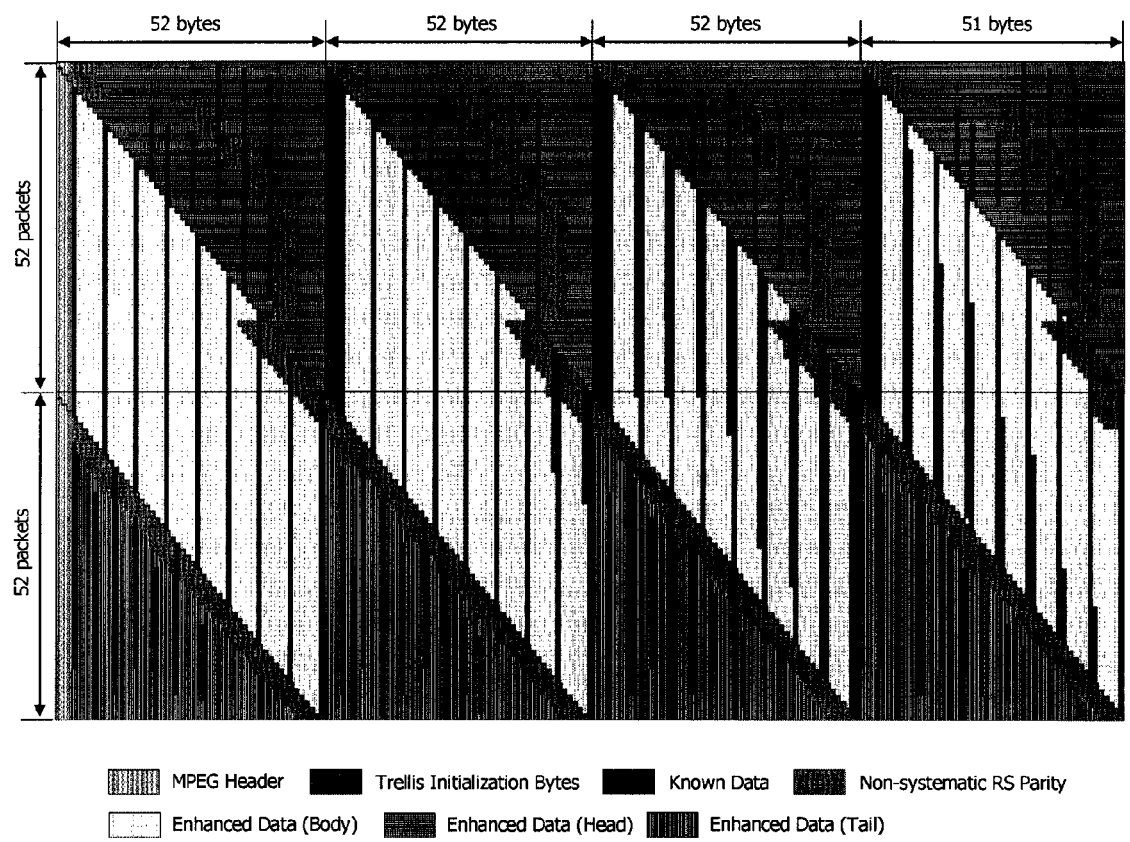
FIG. 5A illustrates a representation of data configuration at the input end of a data interleaver when known data is inserted in a body region in a group on the basis of a period of 6 packets, and known data is inserted in the head and tail regions, according to the present invention.
Figure 5B:
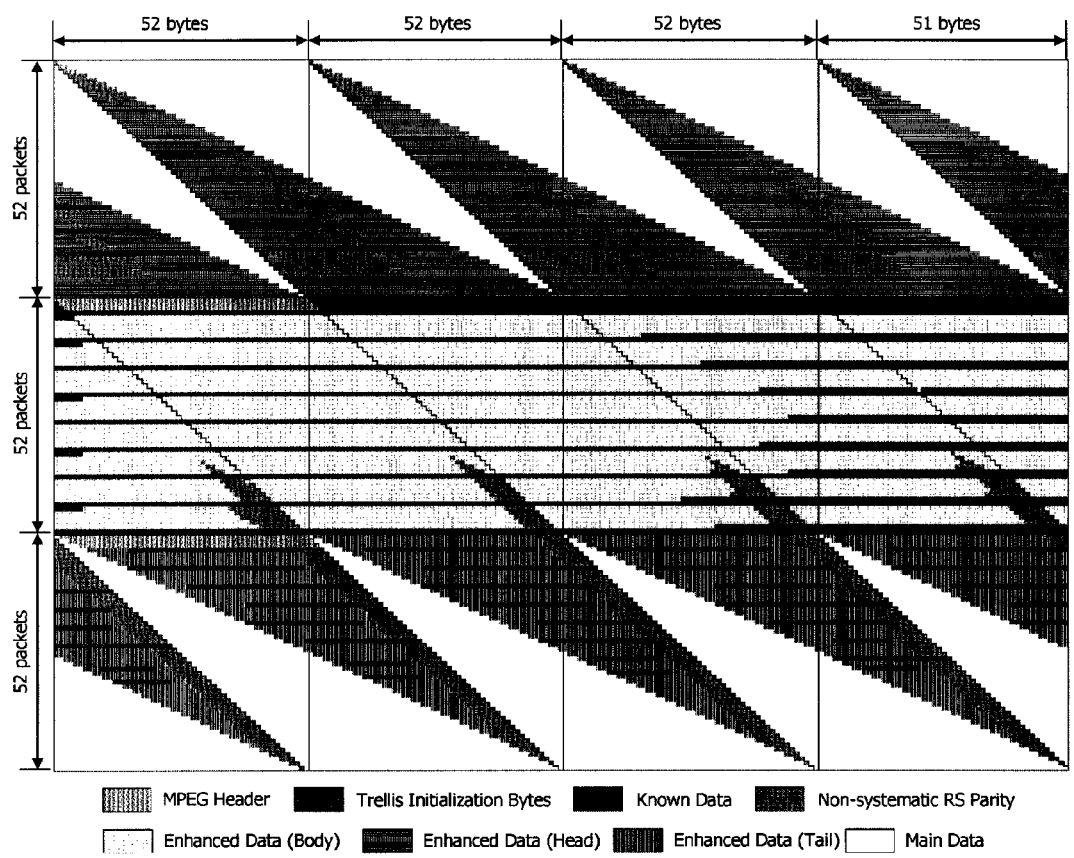
FIG. 5B illustrates a representation of data configuration at the output end of a data interleaver when known data is inserted in a body region in a group on the basis of a period of 6 packets, and known data is inserted in the head and tail regions, according to the present invention.

FIG. 5A and FIG. 5B, illustrate embodiments in which enhanced data groups are configured as FIG. 3A and known data is inserted in the head, body and tail regions. Namely, known data is inserted to the body region at a period of 6 packets (or segments), and also, the known data is additionally added to the beginning part of the body region. Since a relatively long known data sequences cannot be continuously inserted to the head and tail regions, relatively short known data sequences are frequently inserted to the head and tail regions.

Namely, the interleaved data is processed such that their 12 bytes are mixed with symbols according to 12-way interleaving and then encoded by a trellis encoder (not shown). Since the length of the continuous enhanced data in the head and tail regions is shorter than that in the body region, the enhanced data may be mixed with main data, on the, basis of symbol unit, when performing 12-way interleaving. Therefore, continuous known data cannot be formed in a place where the enhanced data is mixed with main data on the basis of symbol unit.

As shown in FIG. 5, when the known data is inserted to the head and tail regions, 12 bytes are selected to be allocated to the known data, complying with 12-way interleaving unit, using only the enhanced data, such that the enhanced data, which will become known data, and main data, which cannot become known data, can not be mixed in the symbol domain. Also, when 12 bytes are converted to 48 symbols in order to initialize a memory of the trellis encoder, only first 24 symbols are used for trellis initialization. After performing such trellis initialization, the remaining 24 symbols cannot be used as the known data. Namely, a relatively long known data sequence can be inserted into the body region, and a relatively short known data sequence can be inserted into the head or tail region.

FIG. 5A illustrates a representation of data configuration at the input end of a data interleaver when known data is inserted in a body region in a group on the basis of a period of 6 packets, and known data is inserted in the head and tail regions, and FIG. 5B illustrates a representation of data configuration at the output end of a data interleaver when known data is inserted in a body region in a group on the basis of a period of 6 packets, and known data is inserted in the head and tail regions.

Here, the trellis encoder, which is located at the rear end of the data interleaver, has a memory. Since the output of the trellis encoder is determined by the present input and earlier input, it is necessary to initialize the memory of the trellis encoder to a predetermined value in order to output a certain signal at a certain time point. When the memory of the trellis encoder is required to be initialized, or when the memory input at the beginning of known data sequence, a part of the known data is substituted with initialization data and then outputted to the trellis encoder. After that, the memory of the trellis encoder is initialized to a predetermined value by the initialization data. After performing initialization, the output of the trellis encoder can be changed to known data, which is encoded to comply with the transmitting/receiving systems.

As shown in FIG. 4A to FIG. 5B, the known data with predetermined length is inserted to the body regions, at a period of 6 packets (or segments). Here, the known data is inserted to the body region such that the RS parity parts can be located in the head or tail region, as much possible as, and not in the body region.

Since the body region can enhance receiving performance, compared with the head or tail region, the RS parity, not the enhanced data, is located in the head or tail region, such that amount of enhanced data in the body region can be increased. Here, on the basis of output of the rear end of the data interleaver, the RS parity is preferably located such that it is outputted therefrom later than the known data for initialization.

To this end, the known data is additionally inserted to the beginning part of the body region, as shown in FIG. 4A to FIG. 5B. Also, when the known data is periodically inserted thereto, a known data sequence, which is longer than the known data sequence of another period, is inserted thereto at some part of the period. In addition, when the initialization data is in a B region of the body region referring to FIG. 2, the length and place of the known data sequence are determined such that the RS parity is in the head region (or an A region). When the initialization data is in a C region of the body region, the length and place of the known data is determined such that the RS parity can be in the tail region (or a D region).

Here, when initialization data for a packet does not exist in the B region, the RS parity for the packet is located in the head region. However, RS parity for the packet of the C region is located at the D region regardless of the initialization data.

Also, when receiving performance at a portion near the body region does not remarkably differ from that of the body region, it is preferable to select a non-systematic RS parity place in the enhanced data group such that the enhanced data can be located in the portion, instead of main data, such as an RS parity.

As shown in FIG. 4A to FIG. 5B, on the basis of output sequence of the rear end of the data interleaver, an RS parity is located at a place in the head region, in which it is outputted therefrom, as quickly possible as. Also, an RS parity is located at a place in the tail region, in which it is outputted therefrom, as late possible as.

Namely, the RS parity must be outputted later than the initialization data in the head regions, but the RS parity place is determined in the head region, such that, of data which is outputted later than the initialization data, the RS parity can be outputted fastest. Also, the RS parity place is determined in the tail region, such that, of data which is outputted later than the initialization data, the RS parity can be outputted last. Therefore, the enhanced data rather than main data can be further allocated to the positions, in which receiving performance is relatively high, in the head and tail regions.

When an enhance data group is divided into head, body and tail regions, the respective regions can take charge of different services. For example, enhanced data, whose importance degree is high or which has high priority, are allocated to the body region, and then transmitted. Here, the body region can enhance receiving performance as known data, whose length is relatively long, is periodically inserted thereto. On the other hand, enhanced data, whose importance degree is low or which has low priority, is allocated to the head and tail regions, and then transmitted. Here, the head and tail regions do not insert known data therein or can insert parts of known data therein. For example, a service for mobile receiving operation is allocated to enhanced data having high priority, and services for indoor or walk receiving operations are allocated to enhanced data having low priority. As another embodiment for hierarchy services, it can be implemented such that only high priority data can be received under a bad receiving state, and auxiliary low priority data as well as high priority data can be received under a good receiving state.

Figure 6:
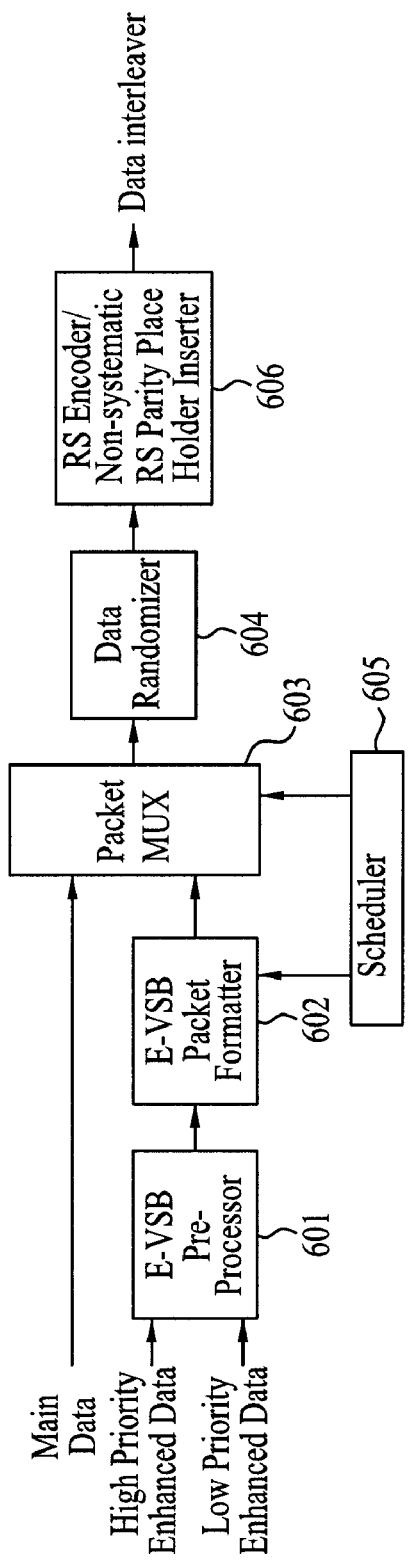
FIG. 6 illustrates a schematic block diagram of a part of a digital broadcast transmitting system according to the present invention.

FIG. 6 illustrates a schematic block diagram of a part of a digital broadcast transmitting system according to the present invention, which includes an E-VSB pre-processor 601, an E-VSB packet formatter 602, a packet multiplexer 603, a data randomizer 604, a scheduler 605, and an RS encoder/non-systematic RS parity place holder inserter 606.

The E-VSB pre-processor 601 inputs enhanced data and performs pre-processing, such as an additional error correction encoding, an interleaving, and a byte expanding through null data insertion, etc. Afterwards, the preprocessing result is outputted to the E-VSB packet formatter 602.

Here, when high priority enhanced data is inputted to the E-VSB pre-processor 601, it performs pre-processing to comply with the level of the high priority enhanced data. For example, the high priority enhanced data may be expanded by four bytes, and the low priority enhanced data may be expanded by two bytes. Also, the enhanced data may be expanded by the opposite ratios, respectively, or by the same ratio. Here, since such extensions can be selectively designed by the inventors, it will be easily appreciated that they cannot limit the scope of the present invention.

The E-VSB packet formatter 602 serves to collect enhanced data on the basis of packet unit and group it, in which the enhanced data is pre-processed by control of the scheduler 605. Here, the high priority enhanced data and low priority enhanced data are properly allocated to the head and body regions in the group. For example, the high priority enhanced data may be allocated to the body region, and the low priority enhanced data may be allocated to the head and tail regions.

Also, the E-VSB packet formatter 602 may allocate the known data in the group. Similar to the foregoing description referring to FIG. 4A to FIG. 5B, known data sequence may be allocated to proper one(s) of the head, body, and tail regions in the group, and trellis initialization data is allocated to the beginning part of the known data.

Here, the packets composing the group are indicative of a plurality of enhanced data packets. A single enhanced data packet is an enhanced data packet of 188 byte unit, in which MPEG header of 4 bytes is added, i.e., an MPEG compatible packet. The enhanced data packet includes at least one of enhanced data and known data.

The enhanced data group is outputted to the packet multiplexer 603. The packet multiplexer 603 inputs a main data packet of 188 byte unit, and then performs time division multiplexing for the main data packet together with the enhanced data group, on the basis of transport packet unit, to output the result thereto.

Namely, the scheduler 605 generates a control signal to output it to the packet multiplexer 603, such that the packet multiplexer 603 classifies the group into head, body, tail regions, and then properly allocates the enhanced data and the known data to the regions.

The packet multiplexer 603 outputs its output to the data randomizer 604. The data randomizer 604 removes an MPEG synchronization byte from the inputted packet and randomizes the remaining 187 bytes using a pseudo byte which is generated therein. The RS encoder/non-systematic RS parity place holder inserter 606 performs systematic RS encoding for the randomized data or non-systematic RS parity holder insertion.

When the 187 byte packet, which is outputted from the data randomizer 604, is a main data packet, the RS encoder/non-systematic RS parity place holder inserter 606 performs systematic RS encoding, like the conventional ATSC VSB system, to add 20 byte parity to the end of the 187 byte data and then outputs it to the data interleaver.

On the other hand, when the 187 byte packet, which is outputted from the data randomizer 604, is an enhanced data packet, the RS encoder/non-systematic RS parity place holder inserter 606 determines 20 RS parity byte places for the inputted packet in the group, as shown in FIG. 4A to FIG. 5B, and inserts a null byte in a predetermined RS parity byte place. Also, the RS encoder/non-systematic RS parity place holder inserter 606 sequentially inserts the bytes in the enhanced data packet to the remaining 187 byte places and then outputs them to the data interleaver. Since the description for input and output of the data interleaver has been already described, referring to FIG. 2 to FIG. 5B, it will be omitted for the convenience of description.

Figure 7:
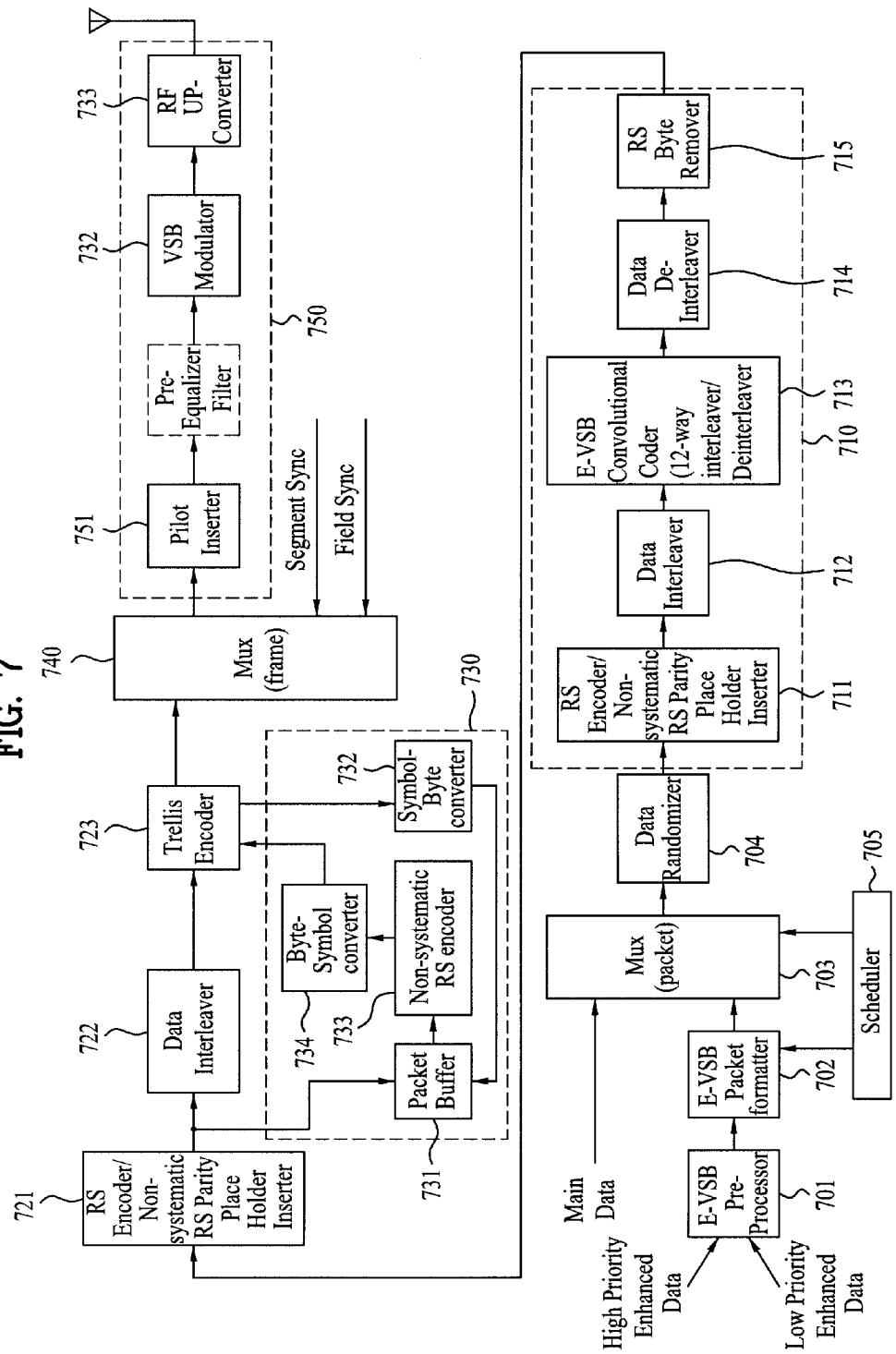
FIG. 7 and FIG. 8 illustrate schematic block diagrams of the digital broadcast transmitting system, according to the present invention, to which the digital broadcast transmitting system of FIG. 6 is applied.
Figure 8:
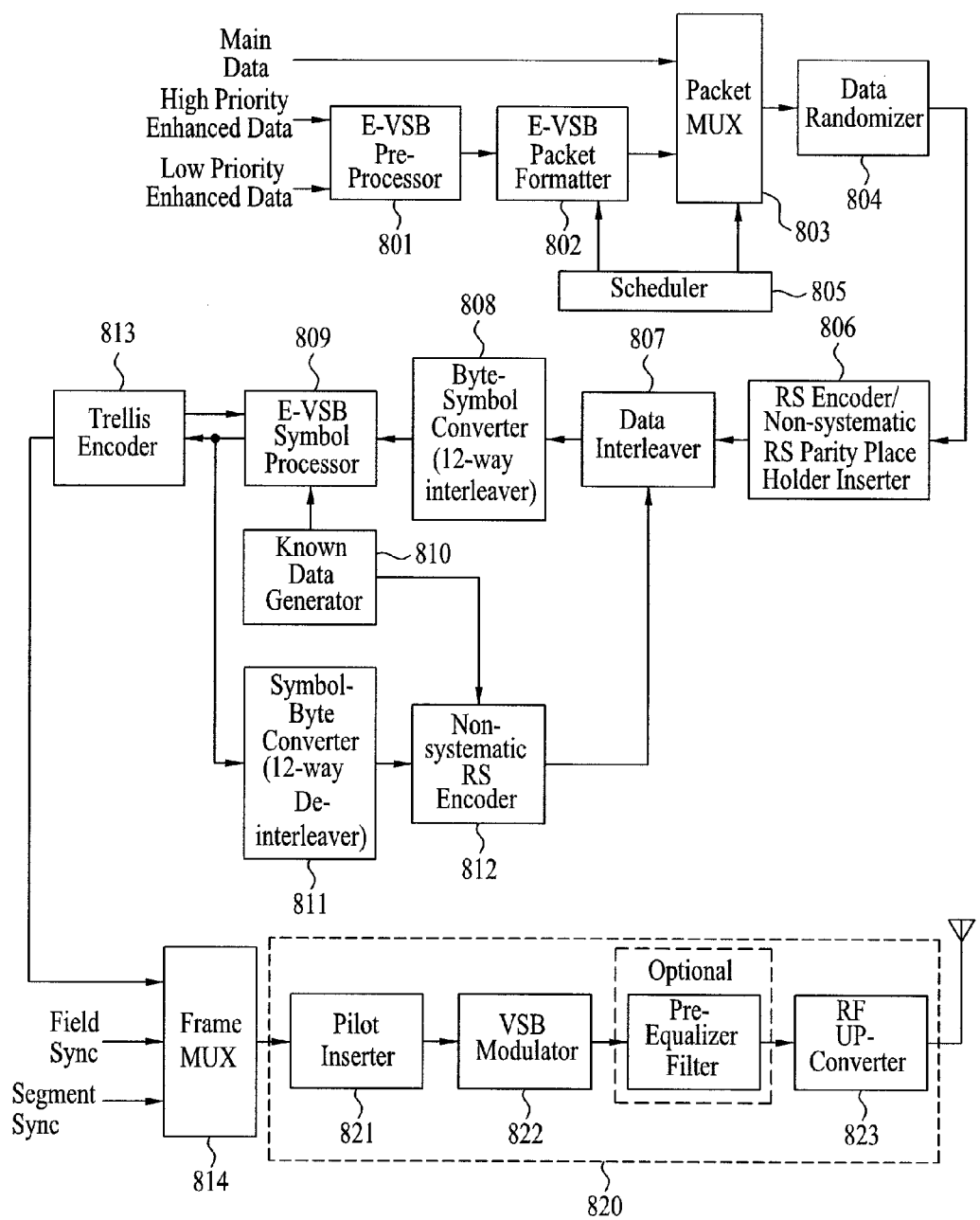

FIG. 7 and FIG. 8 illustrate schematic block diagrams of the digital broadcast transmitting system, according to the present invention, to which the digital broadcast transmitting system of FIG. 6 is applied. Namely, the digital broadcast transmitting system of FIG. 6 includes the E-VSB pre-processor 601, the E-VSB packet formatter 602, the packet multiplexer 603, the data randomizer 604, the scheduler 605, and the RS encoder/non-systematic RS parity place holder inserter 606.

Here, since the elements in FIG. 7, an E-VSB pre-processor 701, an E-VSB packet formatter 702, a packet multiplexer 703, a data randomizer 704, a scheduler 705, an RS encoder/non-systematic RS parity place holder inserter 711, are the same that as those of FIG. 6, their operations will be omitted below, but refer those of FIG. 6.

The E-VBS post-processor 710 includes the RS encoder/non-systematic RS parity place holder inserter 711, a data interleaver 712, an E-VSB convolutional encoder 713, a data deinterleaver 714, and a RS byte remover 715.

The data interleaver 712 performs data interleaving on an output of the RS encoder/non-systematic RS parity place holder inserter 711 and then outputs it to the E-VSB convolutional encoder 713.

The E-VSB convolutional encoder 713 performs convolutional coding on an output of the data interleaver 712 and then outputs it to the data deinterleaver 714.

The data deinterleaver 714 performs data deinterleaving on input data by a reverse process of the data interleaver 712 and then outputs the deinterleaved data to the RS byte remover 715.

The RS byte remover 715 removes the 20-byte parity attached by the RS encoder/non-systematic RS parity place holder inserter 711. In this case, if the inputted data is the main data packet, the RS byte remover removes last 20 bytes from 207 bytes. IF the inputted data is the enhanced data packet, the RS byte remover 715 removes 20-byte RS parity place holder from 207 bytes. This is to re-calculate parities since original data is modified by the E-VSB convolutional encoder 713 in case of the enhanced data.

The E-VSB convolutional encoder 713 converts inputted bytes to symbols, performs convolutional coding on an enhanced data symbol only, converts the coded result to bytes, and then outputs the converted bytes. In particular, the E-VSB convolutional encoder 713 outputs data without modification if an output of the data interleaver 712 is the main data, the MPEG header byte attached by the E-VSB packet formatter 702 or the RS parity byte or parity place holder byte attached to the enhanced data packet by the RS encoder/non-systematic RS parity place holder inserter 711.

Meanwhile, the known data can be inserted in the enhanced data packet by the E-VSB packet formatter 702. Alternatively, the E-VSB packet formatter 702 inserts a place holder of the known data and the E-VSB convolutional encoder 713 inserts the known data in the corresponding place instead of the place holder. And, the E-VSB convolutional encoder 713 outputs the known data symbol without additional coding like the main data.

An output of the RS byte remover 715 is inputted to the RS encoder/non-systematic RS parity place holder inserter 721.

Like the former RS encoder/non-systematic RS parity place holder inserter 711, if a 187-byte packet outputted from the RS byte remover 715 is a main data packet, the RS encoder/non-systematic RS parity place holder inserter 721 attaches 20-byte parity bytes to a rear of 187-byte data by performing systematic RS encoding in the same manner of the conventional ATSC VSB system. In case of an enhanced data packet, a 20-parity byte place is determined and it is able to insert RS parity obtained by performing non-systematic RS encoding in the determined parity byte place or to insert null byte (i.e., RS parity place holder) therein instead of the RS parity. And, bytes within the enhanced data packet are sequentially inserted in the rest 187 byte places among 207 byte places. The null byte can be set to an arbitrary value and is replaced by a parity value calculated by a non-systematic RS encoder 733 of the backward-compatibility processor 730. Hence, the null byte plays a role in holding a place of the parity byte of a non-systematic RS code.

An output of the RS encoder/non-systematic RS parity place holder inserter 721 is outputted to the data interleaver 722 and also inputted to a backward-compatibility processor 730 to re-calculate parity in case of the enhanced data packet.

Besides, the data interleaver 722 performs interleaving on input data according to the same interleaving rule of the former data interleaver 712

An output of the data interleaver 722 is inputted to the trellis encoder 723. And, the trellis encoder 723 encodes a 2-bit input into three bits to output.

An output of the trellis encoder 723 is inputted to the frame multiplexer 740.

The frame multiplexer 740 inserts a field sync and a segment sync in the output of the trellis encoder 723 and then outputs a corresponding signal to the transmitting unit 750.

The transmitting unit 750 includes a pilot inserter 751, a VSB modulator 752 and a radio frequency (RF) converter 753. And, the transmitting unit 750 plays the same role of the conventional VSB transmitter.

Similarly, since the elements in FIG. 8, an E-VSB pre-processor 801, an E-VSB packet formatter 802, a packet multiplexer 803, a data randomizer 804, a scheduler 805, and an RS encoder/non-systematic RS parity place holder inserter 806, are the same that as those of FIG. 6, their operations will be omitted below, but refer those of FIG. 6.

The output data of the RS encoder/parity place holder inserter 806 are provided to the data interleaver 807. Then, the data interleaver 807 interleaves and outputs the received data. At this point, the data interleaver 807 receives a RS parity byte that is newly calculated and outputted by the non-systematic RS encoder 812 and, then, outputs the newly received RS parity byte instead of the non-systematic RS parity place holder.

Each byte outputted from the data interleaver 807 is converted into 4 symbols by the byte-symbol converter 808, which are then inputted to the E-VSB symbol processor 809. Herein, one symbol consists of 2 bits. Additionally, the known data generated from the known data generator 810 are also inputted to the E-VSB symbol processor 809. Herein, the known data consist of the known data symbol generated from the symbol domain. This is because the known data are used in the symbol domain of the receiving system. Also, in the transmitting system, it is more efficient to create a known data symbol sequence having the characteristics desired (or required) by the symbol domain.

The E-VSB symbol processor 809 receives the data outputted from the byte-symbol converter 808 and the known data symbol generated from the known data generator 810, processes the received data with a plurality of processing steps. Thereafter, the E-VSB symbol processor 809 outputs the processed data to the trellis encoder 813 and the symbol-byte converter 811. In other words, the E-VSB symbol processor 809 receives the symbol configured of 2 bits and performs a predetermined process. Then, the E-VSB symbol processor 809 outputs processed symbol configured of 2 bits. In case of a main data symbol, the E-VSB symbol processor 809 outputs the received symbol without any change in data. On the other hand, in case of an enhanced data symbol, the received symbol is processed with a signal process that can provide additional coding gain when used in connection with the trellis encoder 813. However, in the 207-byte enhanced data packet, the 3-byte MPEG header and known data byte and the 20-byte RS parity byte are processed as the main data symbol. Therefore, the bytes are directly outputted without any change in the data value(s).

Meanwhile, when the input data inputted to the E-VSB symbol processor 809 correspond to the known data place holder that is converted to a symbol by the byte-symbol converter 808, the E-VSB symbol processor 809 uses the known data generated from the known data generator 810 instead of the known data place holder.

Also the E-VSB symbol processor 809 generates a data symbol at the beginning of the known data sequence so that the memory of the trellis encoder 813 is initialized to a pre-decided state. In order to do so, the memory value within the trellis encoder 813 should be inputted to the E-VSB symbol processor 809.

Additionally, the trellis encoder 813 is initialized at the beginning of the known data sequence because a plurality of output sequences may be generated depending upon the memory state of the trellis encoder 813 even when the known data sequence is inputted to the trellis encoder 813. Accordingly, the memory state of the trellis encoder 813 is first initialized to a pre-decided value and, then, when the known data are inputted, a desired known data output sequence may be obtained from the output of the trellis encoder 813.

The output symbol of the E-VSB symbol processor 809 is inputted to the trellis encoder 813 so as to be trellis-encoded.

The trellis encoder 813 pre-codes the data that are inputted as the upper bit among the output symbols of the E-VSB symbol processor 809, and trellis-encodes the data that are inputted as the lower bit. Thereafter, the pre-coded data and the trellis-encoded data are outputted to the frame multiplexer 814. Meanwhile, the E-VSB symbol processor 809 receives the 2-bit symbol, processes the received symbol with a plurality of process steps, and outputs the processed symbol. Therefore, the symbol should be converted back to bytes from the symbol-byte converter 811 so that the non-systematic RS encoder 812 can recalculate the RS parity from the output of the E-VSB symbol processor 809. In other words, the input symbol is converted to byte units from the symbol-byte converter 811 and outputted to the non-systematic RS encoder 812. The non-systematic RS encoder 812 calculates the 20-byte RS parity for the data packet configured of 187 information bytes and outputs the calculated RS parity to the data interleaver 807.

The frame multiplexer 814 inserts 4 segment synchronization symbols in each output symbol of the trellis encoder 813, thereby configuring a data segment having 832 data symbols. More specifically, one field synchronization segment is inserted in each of the 312 data segments, so as to configure one data field, which is then outputted to the transmitting unit 820. The transmitting unit 820 inserts a pilot signal in the output of the frame multiplexer 814, the output having a segment synchronization signal and a field synchronization signal inserted therein. The transmitting unit 820 then VSB modulates the pilot signal inserted data and converts the VSB modulated data to an RF signal, which is transmitted through the antenna. Accordingly, the transmitting unit 820 includes a pilot inserter 821, a VSB modulator 822, and a RF-UP converter 823. Furthermore, a pre-equalizer filter may be optionally included.

As described above, the digital broadcast system and a processing method thereof according to the present invention have advantages in that they can be operated such that they are resistant to errors when enhanced data is transmitted through channels, and also they are compatible with conventional VSB receivers. In addition, the digital broadcast system and the processing method thereof can perform receiving operations for enhanced data without errors even though ghost images and noise exist in the channel transmitting the data.

Also, in order to group a plurality of enhanced data packets having information, multiplex the group with main data, and transmit them, the present invention stratifies the group to form a plurality of regions, and classifies types of inserted data, and processing methods, etc., according to characteristics of stratified regions. Therefore, receiving performance of a receiving system can be enhanced.

Especially, when an enhanced data packet is configured to include at least one of enhanced data having information and known data, which are identified at transmitting/receiving ends, and the plurality of enhanced data packets are grouped, the present invention serves to determine a place of known data which is inserted to the group, a place of initialization data, and an RS parity place, referring to characteristics of stratified regions of the group. Therefore, receiving performance of a receiving system whose channel variation is significant can be enhanced.

In addition, the present invention is more effective as it is applied to portable and mobile receivers whose channels vary significantly. Also, the present invention clearly shows its effect in receivers which require resistance to noise.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A digital television (DTV) transmitter for processing main data and enhanced data for transmission, the DTV transmitter comprising:
   a pre-coder for pre-coding the enhanced data for forward error correction (FEC);
   a data formatter for generating enhanced data packets including the pre-coded enhanced data;
   a multiplexer for generating multiplexed data packets by multiplexing the enhanced data packets with main data packets including the main data;
   a randomizer for randomizing data in the multiplexed data packets;
   a Reed-Solomon (RS) encoder for systematic RS-coding the main data packets in the multiplexed data packets and non-systematic RS-coding the enhanced data packets in the multiplexed data packets;
   a data interleaver for interleaving the systematic RS-coded main data packets and the non-systematic RS-coded enhanced data packets and outputting a data group having first, second and third regions, wherein the second region is located between the first and third regions, wherein the second region includes known data sequences and the enhanced data packets, and wherein the first and third region include the enhanced data packets and the main data packets; and
   a trellis encoder for trellis-encoding data in the data group, wherein the trellis encoder provides data for trellis initialization when a beginning of each of the known data sequences is output from the data interleaver, and wherein one or more memory units included in the trellis encoder are initialized with the data for trellis initialization.

2. The DTV transmitter of claim 1, wherein the one or more memory units in the trellis encoder are initialized to obtain a desired known data sequence by inputting the known data sequences from the data interleaver.

3. The DTV transmitter of claim 1, further comprising a backward-compatibility processor for:
   generating new parity data based on an output of the RS encoder and the data for the trellis initialization; and
   providing the new parity data to the trellis encoder.

4. A method of processing main and enhanced data in a digital television (DTV) transmitter, the method comprising:
   pre-coding the enhanced data for forward error correction (FEC);
   generating enhanced data packets including the pre-coded enhanced data;
   generating multiplexed data packets, via a multiplexer, by multiplexing the enhanced data packets with main data packets including the main data;
   randomizing data in the multiplexed data packets;
   systematic Reed-Solomon (RS)-coding main data packets in the multiplexed data packets;
   non-systematic RS-coding the enhanced data packets in the multiplexed data packets;
   interleaving, by a data interleaver, the systematic RS-coded main data packets and the non-systematic RS-coded enhanced data packets and outputting a data group having first, second and third regions, wherein the second region is located between the first and third regions, wherein the second region includes known data sequences and the enhanced data packets, and wherein the first and third region include the enhanced data packets and the main data packets;
   trellis-encoding, by a trellis encoder, data in the data group, wherein the trellis encoder provides data for trellis initialization when a beginning of each of the known data sequences is output from the data interleaver; and
   initializing one or more memory units included in the trellis encoder with the data for trellis initialization.

5. The method of claim 4, wherein initializing the one or more memory units in the trellis encoder comprises inputting the known data sequences from the data interleaver in order to obtain a desired known data sequence.

6. A digital television (DTV) receiver for processing a broadcast signal, the DTV receiver comprising:
   a receiver for receiving the broadcast signal including main and enhanced data; and
   a decoder for decoding the enhanced data included in the broadcast signal, wherein the main and enhanced data are generated via:
      a pre-coder for pre-coding enhanced data by coding the enhanced data for forward error correction (FEC);
      a data formatter for generating enhanced data packets including the pre-coded enhanced data;
      a multiplexer for generating multiplexed data packets by multiplexing the enhanced data packets with main data packets including original main data;
      a randomizer for randomizing data in the multiplexed data packets;
      a Reed-Solomon (RS) encoder for systematic RS-coding the main data packets in the multiplexed data packets and non-systematic RS-coding the enhanced data packets in the multiplexed data packets;
      a data interleaver for interleaving the systematic RS-coded main data packets and the non-systematic RS-coded pre-coded and outputting a data group having first, second and third regions, wherein the second region is located between the first and third regions, wherein the second region includes known data sequences and the enhanced data packets, and wherein the first and third region include the enhanced data packets and the main data packets; and
      a trellis encoder for trellis-encoding data in the data group, wherein the trellis encoder provides data for trellis initialization when a beginning of each of the known data sequences is output from the data interleaver, and wherein one or more memory units included in the trellis encoder are initialized with the data for trellis initialization.

7. The DTV receiver of claim 6, wherein initializing the one or more memory units in the trellis encoder comprises inputting the known data sequences from the data interleaver in order to obtain a desired known data sequence.

8. A method of processing a broadcast signal in a digital television (DTV) receiver, the method comprising:
   receiving, via a receiver, the broadcast signal including main and enhanced data; and
   decoding, via a decoder, the enhanced data included in the broadcast signal, wherein the main and enhanced data are generated via:
pre-coding enhanced data by coding the enhanced data for forward error correction (FEC);
generating enhanced data packets including the pre-coded enhanced data;
generating multiplexed data packets by multiplexing the enhanced data packets with main data packets including original main data;
randomizing data in the multiplexed data packets;
systematic Reed-Solomon (RS)-coding main data packets in the multiplexed data packets and non-systematic RS-coding the enhanced data packets in the multiplexed data packets;
interleaving, by a data interleaver, the systematic RS-coded main data and the non-systematic RS-coded pre-coded and outputting a data group having first, second and third regions, wherein the second region is located between the first and third regions, wherein the second region includes known data sequences and the enhanced data packets, and wherein the first and third region include the enhanced data packets and the main data packets; and
trellis-encoding, by a trellis encoder, data in the data group, wherein the trellis encoder provides data for trellis initialization when a beginning of each of the known data sequences is output from the data interleaver, and wherein one or more memory units included in the trellis encoder are initialized with the data for trellis initialization.

9. The method of claim 8, wherein initializing the one or more memory units in the trellis encoder comprises inputting the known data sequences from the data interleaver in order to obtain a desired known data sequence.

* * * * *